United States Patent
Harti et al.

(10) Patent No.: US 12,382,584 B2
(45) Date of Patent: Aug. 5, 2025

(54) PRINTED CIRCUIT BOARD AND OPTOELECTRONIC MODULE PROVIDING DIFFERENT CHIP ORIENTATION

(71) Applicant: LEICA GEOSYSTEMS AG, Heerbrugg (CH)

(72) Inventors: Ralph Harti, Winterthur (CH); Stefan Kohlgrüber, Feldkirch (AT); Andrey Marinov, Rorschach (CH); Michele Portentoso, Schachen bei Reute (CH)

(73) Assignee: LEICA GEOSYSTEMS AG, Heerbrugg (CH)

( * ) Notice: Subject to any disclaimer, the term of this patent is extended or adjusted under 35 U.S.C. 154(b) by 227 days.

(21) Appl. No.: 18/231,582

(22) Filed: Aug. 8, 2023

(65) Prior Publication Data

US 2024/0057257 A1 Feb. 15, 2024

(30) Foreign Application Priority Data

Aug. 9, 2022 (EP) ..................................... 22189454

(51) Int. Cl.
*H05K 1/18* (2006.01)
*G01S 17/894* (2020.01)
*H05K 1/02* (2006.01)

(52) U.S. Cl.
CPC ............ *H05K 1/181* (2013.01); *G01S 17/894* (2020.01); *H05K 1/0274* (2013.01); *H05K 2201/10121* (2013.01)

(58) Field of Classification Search
CPC .................. H05K 1/181; H05K 1/0274; H05K 2201/10121; H05K 2201/10106; H05K 1/0295; H05K 1/111; H01S 5/0233
See application file for complete search history.

(56) References Cited

U.S. PATENT DOCUMENTS

| | | | | |
|---|---|---|---|---|
| 8,094,460 | B2* | 1/2012 | Magnani | H05K 1/0295 |
| | | | | 361/767 |
| 10,251,277 | B2* | 4/2019 | Ishihara | H05K 3/3442 |
| 10,748,793 | B1* | 8/2020 | Pearson | H10H 20/857 |
| 2015/0069113 | A1 | 3/2015 | Wang et al. | |
| 2021/0302540 | A1 | 9/2021 | Iguchi et al. | |

FOREIGN PATENT DOCUMENTS

EP 2 039 990 A1 3/2009

OTHER PUBLICATIONS

Anonymous, "Helios2 Time of Flight (ToF) 3D Camera with Sony DepthSense IMX556 Sensor : Lucid Vision Labs," (Jul. 4, 2022).
Extended European Search Report dated Jan. 31, 2023 as received in Application No. 22189454.6.

* cited by examiner

*Primary Examiner* — Sherman Ng
(74) *Attorney, Agent, or Firm* — Maschoff Brennan

(57) ABSTRACT

A printed circuit board (PCB) having a lateral extent and comprising a side landing pad for direct bonding of an optoelectronic chip, whereby the side landing pad comprises at least two landing areas being differently oriented with regard to the lateral, thus enabling a bonding of the chip in at least two different lateral orientations relative to the printed circuit board, whereby the electrical connection lengths of the landing areas are equal, and an optoelectronic module based on such a printed circuit board and an according time of flight camera.

21 Claims, 5 Drawing Sheets

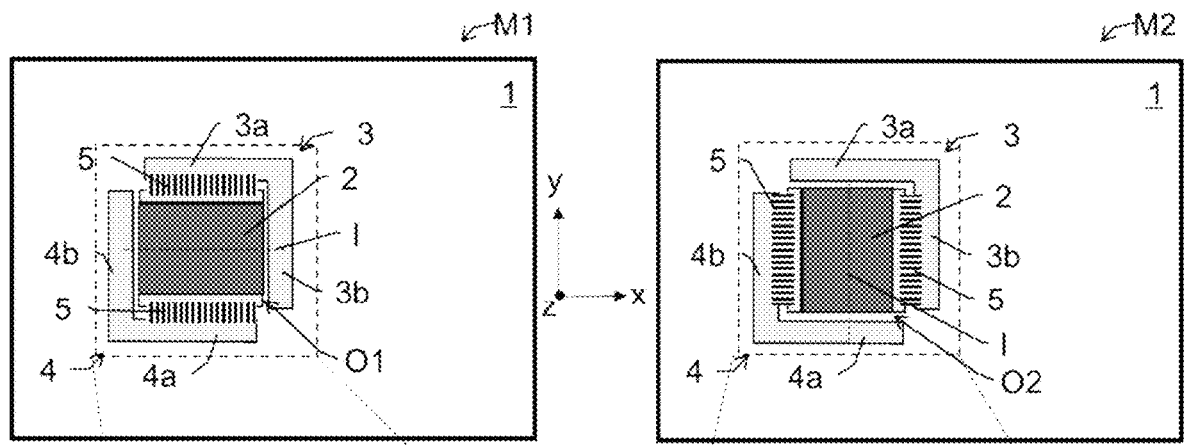
Fig. 1a
Fig. 1b
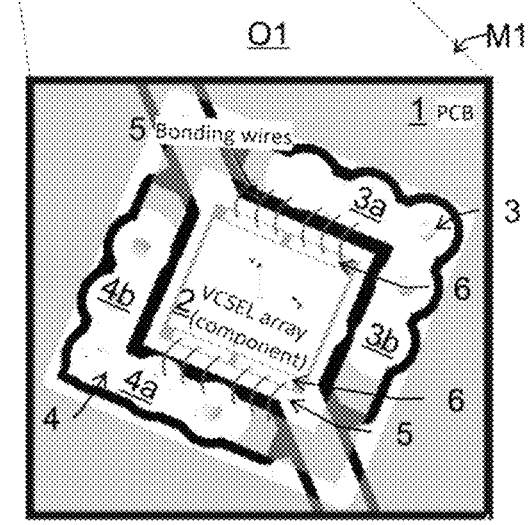
Fig. 1c
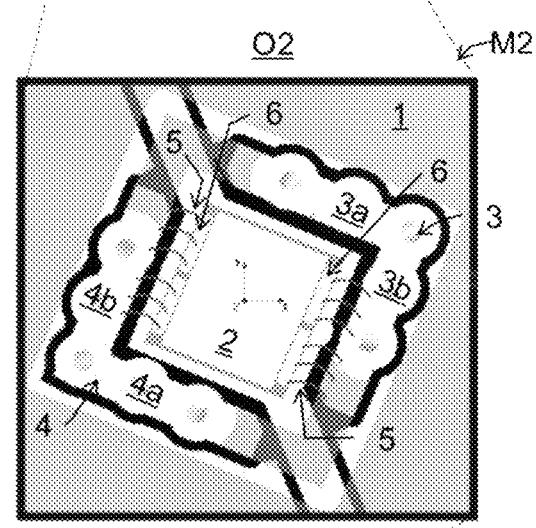
Fig. 1d

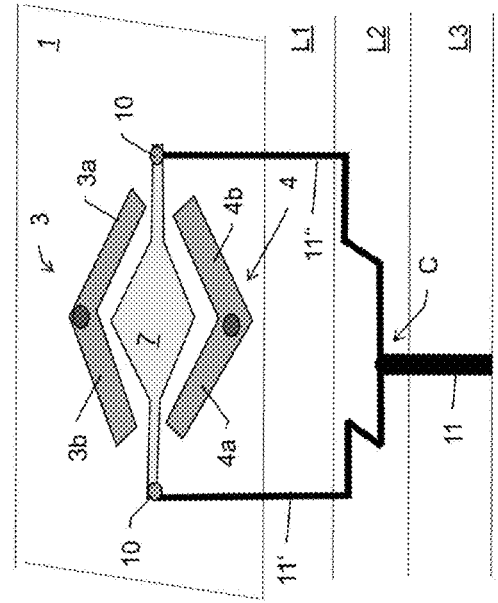
FIG. 2a
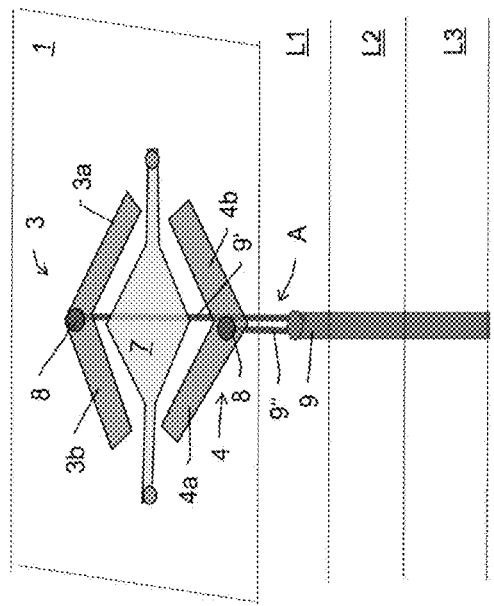
FIG. 2b
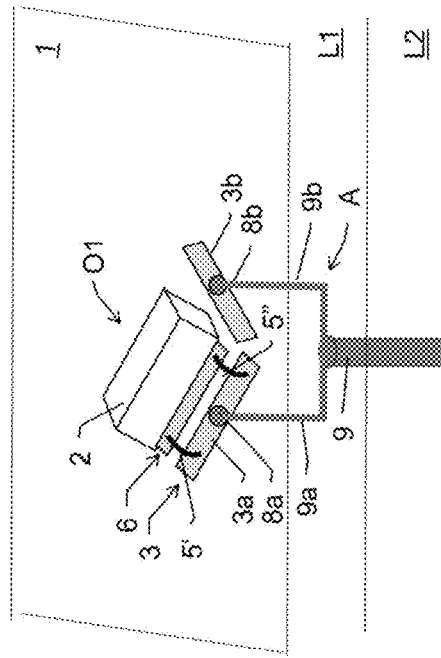
FIG. 3a
FIG. 3b

PRINTED CIRCUIT BOARD AND OPTOELECTRONIC MODULE PROVIDING DIFFERENT CHIP ORIENTATION

BACKGROUND

The disclosure relates to a printed circuit board, an optoelectronic module and a time of flight camera according to the independent claims.

Optical pulses are used for sensing applications such as proximity and ranging sensors, tracking movement, reality capture and 3D measurement using technologies such as structured light or stereo vision. Applications include 3D monitoring or surveillance e.g. for navigation or over shorter distance in advanced driver-assistance systems (ADAS) to detect the presence of pedestrians or bicyclists and avoid collisions in the field.

Optical pulses are specifically required in the area of electro-optical distance measurement, where various principles and methods are known. One approach consists is a so called time of flight (ToF) measurement between a source and an object for determining the depth or distance of the object. By emitting pulsed electromagnetic radiation, having for example a wavelength of 405 nm, 532 nm, 635 nm, 650-690 nm, 780 nm or 785 nm, 795 nm, 808-850 nm, 905 nm, 980 nm, 1064 nm, or between 1500 and 1570 nm, for instance in form of laser light, to a target to be surveyed and subsequently receiving an echo from this target as a back-scattering object, the distance to the target to be surveyed is determined on the basis of the transit time of the pulse.

Hence, time of flight relies on measuring the temporal delay of a short laser pulse. In direct time of flight (dToF), a time gated camera measures the roundtrip flight time of a light pulse. Direct time of flight is well suited for long distances, but the distance resolution is limited to the pulse width and consistency of the laser electronics. A variation on this approach is the indirect time of flight (iToF) method, which modulates a pulse train and measures the intensity phase shift of the reflected light signal to estimate distance travelled. Special detectors measure the amount of measured power out of phase with the modulated signal. Multiple signals in iToF are collected and averaged to improve resolution in distance measurements, but its performance is typically limited to short-range applications.

For any of these applications, one requirement is a radiation source emitting a specific wavelength which can be rapidly turned on and off to generate a short pulse or short pulse sequence of radiation. For illuminating a large scene for example in a surveillance application, a high-energy pulse of radiation is required to be distributed uniformly over a large illuminating area. Short light pulses having high-pulse energy can be generated in Q-switched or mode-locked solid state lasers that are optically pumped. However Q-switched or mode-locked lasers have large footprint, require high electrical energy requirement for operation and elaborate cooling peripheral equipment.

As an alternative light source, semiconductor diode laser sources such as edge emitting laser (EEL) and vertical cavity surface emitting laser (VCSEL) are known in the art, the latter emitting in a direction perpendicular to the wafer or lateral surface. VCSEL can be fabricated with e.g. a height or thickness of 1 to 6 μm and using of GaAs substrate for the wavelengths 650 nm, 850 nm and 980 nm VCSEL, and InP for 1310 and 1550 nm. Other suitable substrate includes semi-insulating GaAs, semi-insulating InP, Si, SiC, and Sapphire. Diode lasers can be operated at drive current that are relatively small as compared to pump current required to operate a Q-switched or a mode locked solid state laser. While EELs are currently used for many applications including short pulse generation for optical communication, VCSELs have several distinct advantages over the EELs that make them more suitable for optoelectronic measurement applications.

Besides their low price, advantages of VCSELs are that VCSEL's packing is simplified compared to EELs due to the vertical nature of the emission surface. In the case where an integrated package is used, the VCSEL offers additional benefits. First, the use of a perpendicular emitting VCSEL array simplifies the fabrication process and reduces fabrication cost and complexity. For example, using a VCSEL array light source allows omission of the 45' fold mirrors required in edge emitting laser diodes. Moreover, unlike edge emitting laser diodes, VCSELs may be integrated into two-dimensional arrays of any desired size on the wafer. Further still, unlike edge emitting laser diodes, VCSELs may be tested at the wafer level. VCSEL arrays also have higher reliability and life expectancy than edge emitters.

As another advantage, the divergence angle of emitted VCSEL light is small, e.g. less than 15°. Consequently, emission from VCSELs is highly directional even at large measurement distances. VCSEL emission in visible and infrared wavelengths may be obtained in a very narrow wavelength band allowing optically efficient filtering of background noise. VCSELs are also amenable to generating short pulses, thereby making these sources suitable for LIDAR type applications and for time domain distance discrimination applications. Further, VCSELs are free of mode-hops that usually affect classical laser diodes.

In general, VCSELs have fast rise and fall times and therefore are capable of producing very short pulses in the nanosecond range. One advantage of short pulses from VCSELs is that the wavelength chirp is small which helps in wavelength filtering and high-speed detection. As another advantage, VCSEL arrays with their large number of emitters do not exhibit speckle effects which are typically seen in the output from EELs or other types of lasers (speckles result from the interference of different reflected portions of the incident beam with random relative optical phases which can result in a visually random granular pattern). Eliminating speckle greatly increases the resolution of the illuminated image.

VCSELs also have a symmetric output radiation pattern resp. an almost-perfect circular Gaussian-like beam shape which makes it much more adaptable to simple optical methods for generating or modifying, the output light for a desirable illumination pattern. For example, different beam shapes including but not limited to, a Gaussian, flat top or ring shape pattern may be generated by suitably designing a VCSEL's aperture or by using external beam shaping devices such as lenses, diffusers, etc.

Especially single mode VCSELs are typically very high-speed devices and can be operated with pulse duration of the order of nanoseconds or less, and rise times of sub-nanoseconds. When operated together, an array of VCSELs produce high-energy pulses with an increased demand on minimizing electrical conductor lengths and reducing inductance. For example, a VCSEL chip with an area of e.g. 5 mm² may produce an output power of the order of 10 W.

For high-speed operation of a VCSEL or VCSEL array, it is important that a fast electrical drive current can be applied. For applying a high-speed driving current it is essential that the parasitic elements are minimized while packaging VCSELs and VCSEL arrays. Furthermore, for high-power operation of VCSEL, high thermal conductivity of the package is also important. For VCSEL arrays to be operated at high speed and at high power of the order of several Watts for example, packaging of the device must incorporate both the requirements simultaneously.

Different arrangements for mounting VCSEL chips on printed electronic circuit boards either for individual operation or collective operation for high output power, are described in number of patent and non-patent publications. However, they all are disadvantageous regarding an arrangement of multiple VCSEL chips—or more generally spoken of multiple optoelectronic chips (emitters for light conversion and detectors for electrical signal conversion)—with respect to their orientation relative to another, spatially separated optoelectronic component such as a light detector for receiving light of all these optoelectronic emitter chips; or said otherwise their orientation in relation to a superordinated frame of reference.

SUMMARY

Thus, the object of the present disclosure is to provide an improved printed circuit board (PCB).

It is a further objective to provide an improved PCB allowing mount of an optoelectronic chip in different orientations.

It is still a further objective to provide an improved PCB allowing mount of an optoelectronic chip in different orientations without differences in response characteristic. It is another object of the present disclosure to provide an optoelectronic module having an improved PCB and an optoelectronic chip.

It is a further object of the present disclosure to provide an improved time of flight camera with multiple optoelectronic emitter chips.

The present disclosure relates to a printed circuit board having a lateral extent and comprising a side/lateral landing pad for direct or wire bonding (of a bondpad-side) of an optoelectronic chip. The printed circuit board can be for example an FR1 to FR4, CEM1, CEM3, Teflon, Rogers, silicon or ceramic printed circuit board having a monolayer, multilayer or HDI construction. To put it another way, printed circuit board should be understood generally to mean a nonconductive carrier material having structures composed of electrically conductive conductor tracks for connecting electronic components and producing electrical networks and for mechanically fixing components.

The side landing pad comprises a number N>1 of lateral landing areas (bonding areas) being differently oriented with regard to the lateral. This enables a direct bonding of the chip (by the bondpad-side) in N different lateral orientations relative to the printed circuit board. The electrical connection lengths of the landing areas are equal, or in other words, the electrical connection length of the direct bonding landing pad is orientation-independent, i.e. equal for all provided bonding orientations.

Optionally, the landing areas are connected or form a common area and share a common or the same anode path. Alternatively, at least some of the landing areas are separated and each landing area is contacted by a respect separate anode path, e.g. comprising a separate via for each landing area. In the case of separate areas, each landing area is preferably electrically connected at its lateral center, e.g. each via is at the center of the surface of a respective landing area.

As another option, the landing areas are electrically connected to a common point by separate feed lines whereby the length of all feed lines are equal.

As still another option, the length of a continuation of the electric path including a respective bonding contact point, e.g. a single bonding wire, is orientation-independent for every single bonding contact point. Hence, not only the signal path to each landing area is equal but the signal path of each landing area to each single chip contact is equal in the first orientation compared to the second or any further orientation of the chip, i.e. equal in all chip orientations.

In specific embodiments, the side landing pad comprises N=2 landing areas arranged rectangular to each other. Specifically for higher numbers of landing areas, the side landing pad encompasses the chip landing area semi-circumferentially (ring pad like). Optionally, the PCB comprises a central bottom (cathode) landing pad for the chip.

The present disclosure also relates to an optoelectronic module comprising a multi-orientation printed circuit board as described above and a chip bonded to the printed circuit board by way of said printed circuit board's landing pad. Preferably, the chip is embodied as an optoelectronic chip, more specifically a light emitting chip, preferably a vertical cavity surface emitting laser (VCSEL). Optionally, the chip has a mounting surface of non-quadratic shape (lateral shape is non-quadratic) in the sense of a rectangular shape with different length and width, whereby as an option the length of each landing area is aligned or adapted to the length (the longer side) of the chip.

The present disclosure also relates to a time of flight camera having an image sensor, the camera comprising at least a first and a second inventive optoelectronic module, whereby the modules are mounted concordantly facing in the same direction with different lateral orientation relative to the image sensor, e.g. arranged "around" the image sensor. Said otherwise, the optoelectronic modules are differently oriented in the camera in or parallel to the imaging plane. The first module has a first light emitting chip bonded in the first lateral orientation (relative to the PCB) and the second module has a second light emitting chip bonded in the second lateral orientation (relative to the PCB), such that the different lateral orientations of the first and second chip relative to the printed circuit board compensates the different lateral orientation of the modules relative to the image sensor.

As a preferred example, the camera comprises two first modules and two second modules, arranged alternately and mounted circumferentially around the image sensor in 90°-steps.

As another option, the camera comprises at least a first and a second inventive optoelectronic module, whereby the modules are mounted concordantly facing in the same direction with same lateral orientation relative to the image sensor or internal frame of reference of the camera, the first module has a first light emitting chip bonded in the first lateral orientation and the second module has a second light emitting chip bonded in the second lateral orientation. Thus, for example there is a camera with an array of VCSELs with different orientation of VCSELs, allowing to customize light emission patterns.

The present disclosure provides the advantage of a PCB which enables different bonding orientations of chip such as an optoelectronic chip. Therewith, optoelectronic modules having such a chip can be manufactured of one and the same PCB. Hence, modules with different chip orientations can be built without having to use different PCBs.

Thereby, same physical lengths for the supply and the return paths are provided. The presented PCB layout provides electrical symmetry for the different bonding orientations of a chip on the PCB. Thus electrical symmetry is provided over the frequency band as well, also advantageous regarding EMC compatibility with the radiated emissions standard (CISPR25 and FCC part 15 B).

In particular, such "one-size-fits-all" PCBs can be the basis of multiple optoelectronic light emitter modules of a ToF-camera which modules are differently oriented within the camera but due to different chip orientations on the modules, the difference in module orientation is compensated. That is, the alignment of the various chips in the camera's or superordinated frame of reference (or "world coordinate frame") or in relation to the image sensor or light receiver is fulfilling the same condition though the alignment of the modules relative to the camera's reference frame the chips are placed on can be different, this without the need of structurally different module PCBs. Seen the other way round, different VCSEL orientations can be provided with same PCBs and same PCB orientation relative to the superordinated frame of reference or in relation to the image sensor, enabling for example customized emission patterns without the need to rearrange PCBs, a need which can arise from using prior art modules and can cause problems such as mechanical collisions. Thereby, the PCBAs presented herein can be identical in all configurations besides the chip orientation, hence, only one PCB-layout or design is needed.

BRIEF DESCRIPTION OF THE DRAWINGS

The PCB, optoelectronic module and ToF-camera will be described in greater detail hereinafter, purely by way of example, with reference to exemplary embodiments depicted schematically in the drawings. More specifically, in the drawing FIGS. 1a-d schematically show a first example of optoelectronic modules with a printed circuit board PCB and a light emitter chip bonded in different orientations, FIGS. 2a,b schematically show in a semi-3D view a scheme of a PCB with showing the conductor tracks for the landing pads, FIGS. 3a,b show schematically another example in a semi-3D view of a PCB with a landing pad having two landing areas and their electrical connection, FIG. 4 schematically shows an example of a PCB with multi-orientation ring-like landing pads in a schematic semi-3D-view.

DETAILED DESCRIPTION

Figure 4:
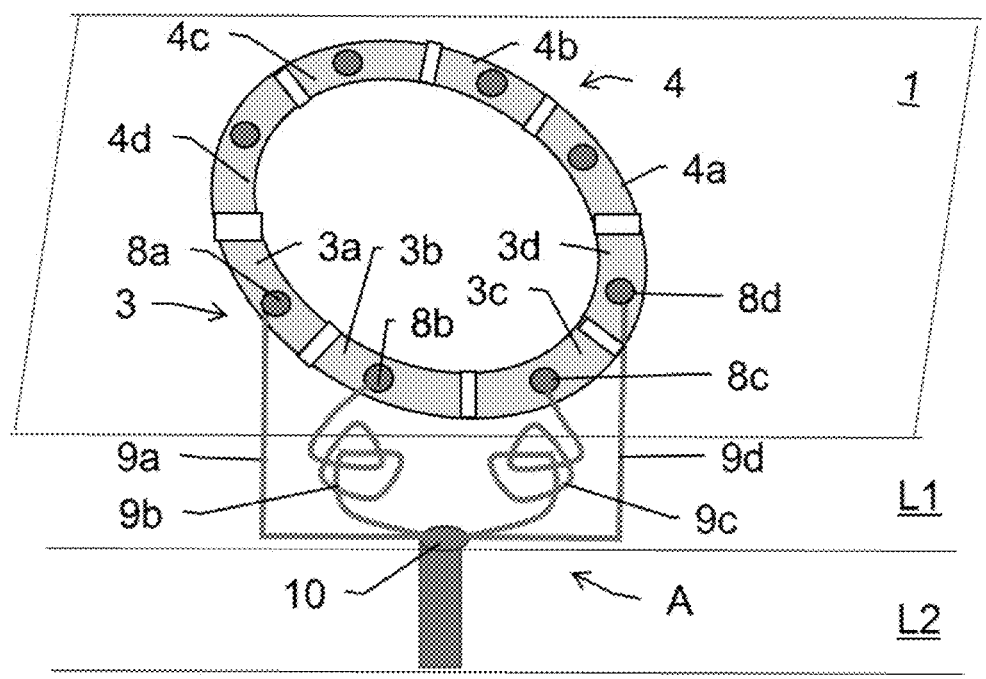

FIGS. 1a,b,c,d show a first schematic example of optoelectronic modules M1, M2 with a printed circuit board PCB 1 and a chip 2, in the example embodied as a vertical cavity surface emitting laser (VCSEL) in a top view. FIGS. 1c and 1d show an enlarged detail of the depiction of FIGS. 1a and 1b respectively.

In the following description, the reference to a "top end," or "top electrical contact" of the device is in reference to an emission surface. Accordingly, the emission end of a device may be referred to herein as the "top end" and an electrical contact to the emission end of the device is referred to herein as the "top contact." The non-emission end is referred as the "bottom end" or "second surface" and the electrical contact to the non-emission end is referred to herein as the "bottom contact" in the exemplary embodiments throughout, unless stated otherwise. In the example, the VCSEL 2 has the emission surface located opposite to the substrate end. Accordingly, the bottom and top terminals comprise the substrate end and the active layer end, respectively. It is noted that according to common practice, the thickness of the diode's semiconductor substrate can be reduced for efficient heat dissipation. As indicated in the figures, the lateral plane is denoted as the xy-plane whereas different (semiconductor) layers lie on top of each other in the z-direction.

The VCSEL 2 has for example a light emitting region which is a semiconductor gain medium disposed between two such as distributed dielectric or semiconductor Bragg gratings, or semiconductor, dielectric or metal gratings or reflecting metal. As in particular advantageous for long-range distance measurements, the length of the laser cavity can be chosen that small that any mode-hop is impossible.

The PCB 1 may include besides a front or top side routing layer multiple layers (cf. FIG. 2) and/or a back or bottom side routing layer. The top side routing layer can be a front redistribution layer (RDL), which may be formed directly on the underlying structure in a layer-by-layer process using thin film processing techniques. For example, a front RDL may include one or more metal traces, one or more dielectric layers, vias, and contact pads 3, 4. The RDL may be formed of suitable materials. For example, the dielectric layer(s) may be formed of a photoimageable dielectric material including polymers (e.g. polyimide, epoxy, epoxy blends, etc.) or inorganic materials (e.g. oxide, nitride), while the metal traces and vias may be formed of a suitable metal.

The PCB 1 may comprise a core with a plurality of cavities and a plurality of vertical vias (cf. FIG. 2). Vertical vias may be copper pillars, for example, formed using a plating technique after drilling via holes through the PCB core. The PCB core may be a laminate body. For example, the PCB core can be a composite of woven fiberglass cloth and polymer (e.g. resin). The PCB core may be formed of a variety of suitable PCB materials including FR4, polyimide, etc. The PCB may comprise a controller chip and/or the VCSEL 2 can be connected to an output stage semiconductor of a laser driver integrated in the PCB 1. The PCB 1 may additionally include a plurality of solder bumps, e.g. on the bottom of the back side routing layer, for example, for mounting on a mother board or other system component of an electronic device, e.g. a time of flight camera as described below.

The PCB 1 includes top side landing pads 3, 4 and may include bottom side landing pads, too. Contact pads 3, 4 may be formed of one or more metals, including copper or gold.

The VCSEL array or chip 2 bottom pad is bonded to a large central pad (cf. FIG. 2) of the printed circuit board 1. The VCSEL array top bondpads 6 are bonded by wires 5 on two opposite sides to a side landing pad 3 respectively side landing pad 4 around the VCSEL array 2.

Each landing pad 3, 4 provides multiple, in the example two direct bonding or landing areas which each can be directly bonded to a respective bonding side 6 of the chip 2. I.e. land pad 3 comprises a first landing area 3a and a second landing area 3b, land pad 4 has a first landing area 4a and a second one 4b. The landing areas 3a,b resp. 4a, 4b of a respective landing pad 3, 4 are differently oriented: landing areas 3a and 4a stretch in the x-direction whereas landing areas 3b and 4b extend in the y-direction. In other words, each landing pad 3, 4 has two landing areas 3a,b and 4a,b which are rectangular to each other.

This design of the respective landing pad 3 or 4 with various, differently oriented bonding areas or parts 3a,3b or 4a, 4b allows to bond a VCSEL either in a first lateral orientation O1 as shown in FIGS. 1a and 1c or in a second lateral orientation O2 as depicted in FIGS. 1b and 1d. In the example, the long, bonding side 6 of the chip 2 runs in the x-direction and is wirebonded by the "upper" and "lower" landing areas 3a, 4a in the first orientation O1 whereas in the second orientation O2 the long side 1 runs in the y-direction and is wirebonded by the "left" and "right" landing areas 3b, 4b.

Or seen otherwise, the VCSEL's emitting surface can be oriented in two ways, whereby in each case it is facing in the same vertical or z-direction but is rotated by 90° when comparing the first orientation O1 and the second orientation O2. That is, one and the same type of printed circuit board 1 can be made to optoelectronic modules M different with regard to the orientation of the mounted or bonded optoelectronic chip 2, e.g. a first module M1 and a second module M2, both "only" differing in orientation of the optoelectronic chip 2. Of course, further different components (e.g. 100 Ohm instead of 47 Ohm) can be applied—but don't have to—, as long as the PCBs 1 with all footprints are the same.

The chip 2 can be mounted to the printed circuit board 1 for example using chip-on-board technology (COB), also designated as "bare chip mounting" by German speakers. In this case, the embodiment shown contact-connects the top side of the chip 1 resp. its bond pads 6 directly with a bonding wire 5; the underside, by means of a conductive layer on an intermediate element—on which the semiconductor 2 is conductively mounted by its lower contact area —, can likewise be connected onto the printed circuit board 1 by means of a bonding wire. COB bonding connections are often potted for protection against mechanical and/or chemical damage, e.g. using epoxy resin or the like. An exposed VCSELs can be encapsulated by transparent adhesive layer.

The semiconductor laser diode 2 can also be directly fitted on the printed circuit board 1, for example soldered or, by means of conductive plastic or adhesive such as epoxy, mechanically and electrically connected to a second conductor track (cathode path) of the printed circuit board 1. The first, upper connection of the semiconductor is in this case connected onto a first conductor track (anode path) of the printed circuit board 1 by means of bonding wires 5. The first and the second conductor track resp. the anode and the cathode path are of same length for both orientations O1 and O2 as is described in more detail in the following figure.

FIGS. 2a,b show in a semi-3D view a scheme of a PCB 1 with showing the conductor tracks for the anode landing pads 3, 4 as well as the cathode landing pad 7, whereby for better clearance, both tracks are shown separately, FIG. 2a showing the anode path A, while FIG. 2b shows the cathode path C.

As depicted in FIG. 2a, each anode landing pad 3, 4, having two landing areas 3a, 3b resp. 4a, 4b as described above, is contacted by a top contact 8 by a respective conductor trace 9', 9" at the pad's lateral center, i.e. at the point where the two landing areas 3a, 3b and 4a, 4b meet. By this central contacting of both landing areas 3a, 3b resp. 4a, 4b of a land pad 3, 4, the anode path A is equal for both areas 3a, 3b resp. 4a, 4b of an anode pad 3, 4. In other words, the electrical connection length of a landing pad 3, 4 is orientation independent.

The first trace 9' leads to the first landing pad 3, the second trace 9" to the second landing pad 4. In the example, both electrical lines 9', 9" are of same length (in the figure, they are drawn differently long only due to the 3D-perspective) and start from a common point 9 in the first layer L1, which goes through the further PCB layers L2, L3, e.g. in form of a via or any other sort of multilayered electrical signal lines in the PCB 1.

FIG. 2b shows the cathode path C defined by the central bottom cathode 7 which is contacted on both ends at contact point 10 by electric traces 11' and 11". Also the cathode traces 11', 11" are of equal length and combined to a common trace or via 11 through PCB layers L1-L3. Thus, also the cathode path C is equal for all mounting orientations, irrespective if the chip is contacted via the first landing areas 3a, 4a or the second landing areas 3b, 4b.

The shown design is an example for a PCB 1 having differently oriented anode landing areas 3a,b and 4a,b for enabling differently laterally positioned chip bonding whereby the lengths of the electrical channels A, C provided within the PCB 1 are the same regardless of the chosen orientation. Hence, the path length to and from each landing pad 3, 4, 7 resp. for each landing area 3a,b, 4a,b is orientation independent which is important for applications of high temporal precision. For example, emitting a light pulse by a VCSEL mounted to the PCB 1 is well defined with respect to time regardless of the orientation with which the VCSEL is mounted. In other words, VCSELs in first and second orientation can be driven in the same way.

In order that the lead inductance to a semiconductor laser is kept low, said laser is contact-connected onto the conductor tracks 9, 9', 9", 11, 11', 11" of the printed circuit board 1 on a short path, hence, said VCSEL is directly connected to the printed circuit board 1 by contact area 7 and the other contact area is directly contact-connected onto the first conductor tracks 9, 9', 9" of the printed circuit board 1 e.g. by means of bonding wires 2 resp. contact strips 3a, 4a, 3b, 4b. A common (single) cathode configuration for an entire VCSEL array can be used while fabricating VCSELs on a single wafer. Otherwise, in the case of a discrete VCSEL case, separate cathode can be connected together on the substrate.

FIGS. 3a, 3b show another example in a semi-3D view of a PCB 1 with a landing pad 3 having two landing areas 3a, 3b and their electrical connection. In this exemplary schematic embodiment, the landing areas 3a, 3b of land pad 3 are again differently oriented but this time separated from each other, i.e. there is a non-conductive gap between them. Each landing area 3a, 3b is separately contacted to a feed line 9a resp. 9b, whereby the two feed lines 9a, 9b meet at a common point 9 within a layer L1 of the PCB 1.

The contact point 8a, 8b of each landing area 3a, 3b is at its (lateral) center. This design with a central feed of each landing area 3a, 3b enables that not only the length of the electrical path to each landing area 3a, 3b is equal but also the final part of the anode path by each landing area 3a, 3b to a respective chip port is equal.

In other words as depicted, the complete anode path to bonding wire 5' and bonding wire 5" is the same for both orientations O1, O2 as can be seen when comparing FIG. 3a, showing the chip 2 mounted in the first orientation O1 and FIG. 3b showing chip 2 in the second orientation O2. Hence, regardless of the chosen chip orientation, each bonding wire 5', 5" has the same respective distance to the point of contact 8a, 8b, i.e. the distance of a bonding wire 5', 5" to the feed line 9a or 9b is in the first orientation O1 the same as it is in the second orientation O2. In contrast thereto resp. seen the other way round, in case of an embodiment different in this regard as depicted in FIGS. 1a-2b, e.g. bonding wire 5' has more distance to the point of contact in the first orientation O1 (longest distance from the edge of the landing pad to its one end) than in the second orientation O2 (shortest distance from the edge on the other side).

FIG. 4 shows another example of a PCB 1 with multi-orientation landing pads 3, 4 in a schematic semi-3D-view. In this example, each landing pad 3, 4 is shaped semi-circumferentially, forming together a circular or ring-shape bonding structure of two (separate) semicircles. Each landing pad 3, 4 is divided into a number N of electrically separate landing areas, the four landing areas 3a-3d of the one side landing pad 3 and the corresponding or opposite landing areas 4a-4d of the second side landing pad 4.

As in the previous example of FIGS. 3a,b, each landing area or section 3a-3d is contacted centrally at contact points 8a-8d by contact traces 9a-9d which are joined at a common point 10 (the feed lines of the second pad 4 are omitted for simplicity of depiction). As purely schematically indicated in the figure by the coil of the feed lines 9b and 9c compared to the straight feed lines 9a, 9d, all feed lines 9a-9d have same length. That is, all traces are equally dimensioned such that regardless of the (lateral) distance of a respective landing area 3a-3d from the common point 10, the anode path A is equal or in other words, though the anode channel A has different branch-offs, it is orientation independent with regard to path length. Therefore, whether bonding an opto-electronic chip by bonding area 3a, 3b, 3c or 3d does not influence the response of the chip respectively the PCB 1.

Figure 5:
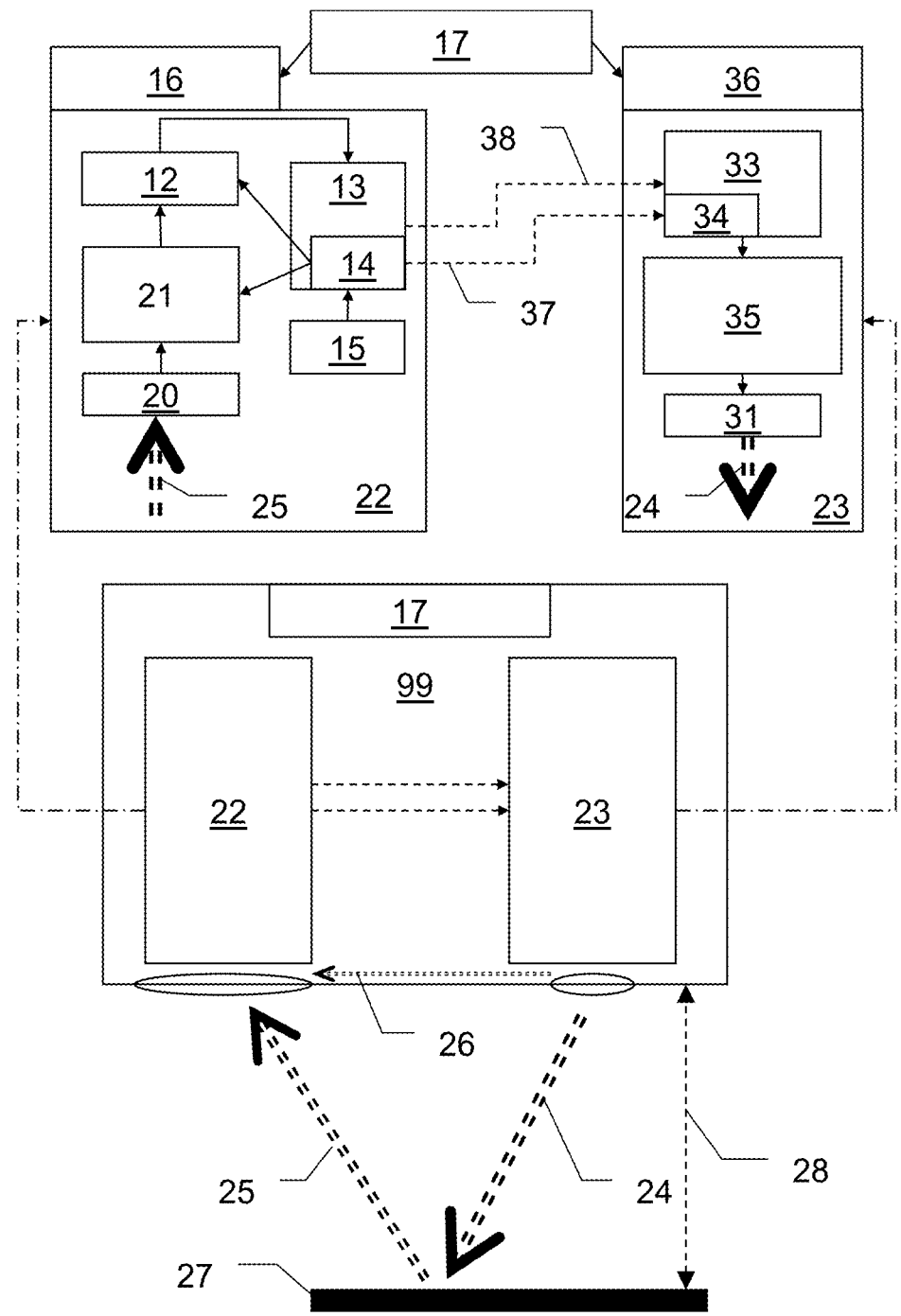
FIG. 5 shows an embodiment of a time-of-flight camera as a block diagram.

FIG. 5 shows an embodiment of a time-of-flight camera 99 as a block diagram. This can be, for example, a handheld, battery-operated distance measuring device or some other surveying instrument, such as are used for example diversely in the construction site sector. The lower half of the figure illustrates the two blocks—separated— of the transmitting unit 23 and the receiving unit 22, which can be separated from one another in terms of EMI engineering by means of corresponding measures, for example by an EMI barrier. In this case, the separation illustrated should be regarded primarily in functional terms and can (but need not) be constructed in the form of two physically separated units. The target object 27 whose distance 28 is to be determined reflects at least part of the electromagnetic radiation 24 emitted by the transmitting unit 23 as a reception signal 25 back to the receiving unit 22. The upper half of the figure illustrates in each case a block diagram of an exemplary internal construction of an embodiment of the transmitting unit 23 and receiving unit 22. In this case, part of the emitted radiation can also be guided as a reference beam 26 via a reference path of known length to the receiving unit 22. In this case, a respective dedicated or else a common receiving unit 22 can be provided for the reference beam 26 and the measurement beam 25. In the case of a dedicated reference receiver, the receiving unit 22 or parts thereof (e.g. 20, 21, 12) should be embodied correspondingly doubly. A changeover between reference beam 26 and measurement beam 25 is also possible.

The transmitting unit 22 has a control processor 33 and a driver stage 35 for the emitting component 31. The emitting component 31 converts the electrical signals of the driver stage 35 into electromagnetic radiation 24 (e.g. a laser diode with stimulated emission). A phase locked loop (PLL) 34 is illustrated in the control processor 33, which PLL can alternatively also be arranged in the driver stage 35, but also externally. Moreover, control processor 33, driver stage 31 and PLL 34 can be integrated in a common chip. The supply filter 36 connects the transmitting unit 23 to the voltage supply 17. The supply filter 36 can—depending on the interference that occurs—be embodied by a simple backup capacitor through to complex LCR filter networks and, if appropriate, can also contain a voltage stabilization and/or regulation or a step-up or step-down converter. A driver stage 35 besides a construction made from a plurality of discrete components, can also be completely or at least largely integrated into a semiconductor component, e.g. into an ASIC, by means of standard semiconductor processes. Besides the drive signal generation and also, if appropriate, the output stage (or at least parts thereof), as a consequence, further system components such as e.g. the PLL 34, the drive logic 33 or the processor 33 in the form of a digital computer, memory cells, etc., can also all be integrated in a common transmitter chip. The latter requires only a minimal number of external components for operation, a so-called 1-chip solution. One embodiment of an EDM can thus be realized for example by two chips, for the transmitting unit 23 and the receiving unit 22, which, apart from the photo-active elements and diverse components that cannot be integrated, require hardly any external components.

The receiving unit 22 converts received electromagnetic radiation 25 into an electrical signal by means of the receiving element 20, said electrical signal being conditioned (for example amplified, filtered, subjected to heterodyne or homodyne mixing, etc.) for further processing in the conditioning unit illustrated as the block 21. The conditioning unit 21 can therefore be, for example, an input filter, an amplifier, a mixing stage, a sample&hold element, etc., or else a combination thereof. The receiver 20 of the optical radiation 25 can use as the receiving element e.g. a photodiode, for example an avalanche photodiode having a corresponding bias voltage, or a CMOS chip. The—in accordance with the modulation of the emitted optical signal (and thus also of the received optical signal)—high-frequency electrical output signal of the photosensitive element 10 can be conditioned prior to further processing and conditioning 21, in particular by being subjected to impedance conversion, amplification and/or band limiting (for instance with an analog, active or passive filter, a transimpedance amplifier (TIA), . . . ). As an alternative to a transimpedance condition at the output of the receiver 20, the input of the conditioning 21 can also be designed in such a way that the latter is adapted to the output characteristic of the receiving element 20.

The conditioned reception signal is digitized—that is to say quantified in terms of time and value—by an analog-to-digital converter 12 and fed to a digital computing unit 13 (a microprocessor, DSP, FPGA, ASIC, etc.) for further processing and determination of the distance. Furthermore, a PLL 14 together with an oscillator 15, for example a quartz oscillator, are connected. As usual in electronic circuit, here as well a filtering 16 (as already mentioned above) of the voltage supply 17 is illustrated, which can be positioned not only globally for the entire circuit, but also in a dedicated manner for individual components of the circuit.

The division of the EDM system as shown in the figure can in particular also be utilized for avoiding or reducing crosstalk of the electrical signals, which contributes to an increased signal quality and thus to a more accurate or faster measurement. In this case, an improved suppression of crosstalk effects can be achieved by the implementation of a local separation of signals which are asynchronous or not in phase for the signal evaluation. Specifically, in direct sampling systems, a strictly synchronous receiver design can thus be achieved, for example. In the case of homodyne mixing, for example, the asynchronous signals that occur in this case are also often perpetrators of interference in the measurement signals.

In EDM designs, the transmitter 23, specifically the laser diode driver 35, is often one of the primary interference sources. In order to generate the short optical pulses having a high intensity which are required in a manner governed by the measurement principle, short current pulses having high peak values, steep edges and a correspondingly broad-edge frequency spectrum are required in the driving. Moreover, the modulation and emission frequencies, on account of the evaluation principle, are usually also in the same order-of-magnitude range as the evaluation frequency, which makes it more difficult or impossible for the interfering frequency range to be filtered out in a simple manner.

In order also to synchronize the transmitting circuit with the receiver, a clock signal output of the PLL 14 (or DLL 14) can also be led from the receiver 22 to the transmitter 23. Specifically, by transmitting a clock signal 37 synchronized by the receiver PLL 14 (instead of the asynchronous oscillator signal), it is possible to achieve a high synchronization accuracy, which also precludes an oscillator-PLL jitter. Since the transmitting unit 23 likewise has a PLL 34, it is sufficient, for the purpose of synchronization, to transmit a signal 37 of relatively low frequency (relative to the high evaluation clock rates), which affords advantages both with regard to the interference emission and with regard to the driver stages and power required for transmission. As a result of the signal direction from the receiver 22 to the transmitter 23 it is possible (specifically also on account of the impedance ratios of signal output to signal input) for crosstalk in the opposite direction to be kept small.

Besides the synchronization of the transmitter 23 relative to the receiver 22, these two circuit sections can have a communication connection 38 for controlling the sequences required for the measurement. In order to avoid crosstalk, such a communication can likewise take place in the same direction as the clock signal 37—that is to say unidirectionally from the interference-sensitive receiver 22 toward the transmitter 23, which is usually the perpetrator of interference. In this case, the communication 37 can likewise be effected synchronously with the transmitted clock signal 38, for example as a unidirectional, synchronous serial interface, as a result of which communication-dictated interference can additionally be avoided.

If appropriate, the system can also be supplemented by an external processor, microcontroller or DSP, which can perform especially evaluation or interfacing tasks. They can be accommodated as described on a common printed circuit board or two separate printed circuit boards, which are then electrically (and if appropriate also mechanically) connected to one another. The separation of transmitter 23 and receiver 22 also allows each of the two separate circuit sections to be given a specifically tuned supply filter 16, 36, as a result of which crosstalk via the voltage supply 17 can also be prevented or at least reduced. Furthermore, corresponding EMI barriers (e.g. in the form of EMI interference arresters, guard banding layouts, shields, metal cages, shielding metal foils or metal sheets, etc.) can also be fitted between transmitter 3 and receiver 2.

In this case, transmitter 23 and receiver 22 can be separated locally, for instance by the use of respectively dedicated chips (FPGAs, ASICs, . . . ). The latter can indeed be physically accommodated on a common printed circuit board given corresponding configuration separated technically in terms of layout. A construction of the EDM system with two separate printed circuit boards (where printed circuit boards can also be taken to mean carrier substrates of circuits using thick-film or thin-film technology) allows, if appropriate, more flexibility in the instrument design (e.g. also for optical alignment of the emission direction of the emitter 30 of the transmitter 23 relative to the receiving element of the receiver 22—or vice versa, and of the component arrangement within the instrument 99). A higher suppression of crosstalk can be achieved by means of the separation and a corresponding instrument design. The concept of a PCB resp. an optoelectronic module as discussed above allows for such a time of flight camera 99 with such a separate transmitter-emitter design in an improved manner as is further described in the following figure.

Figure 6:
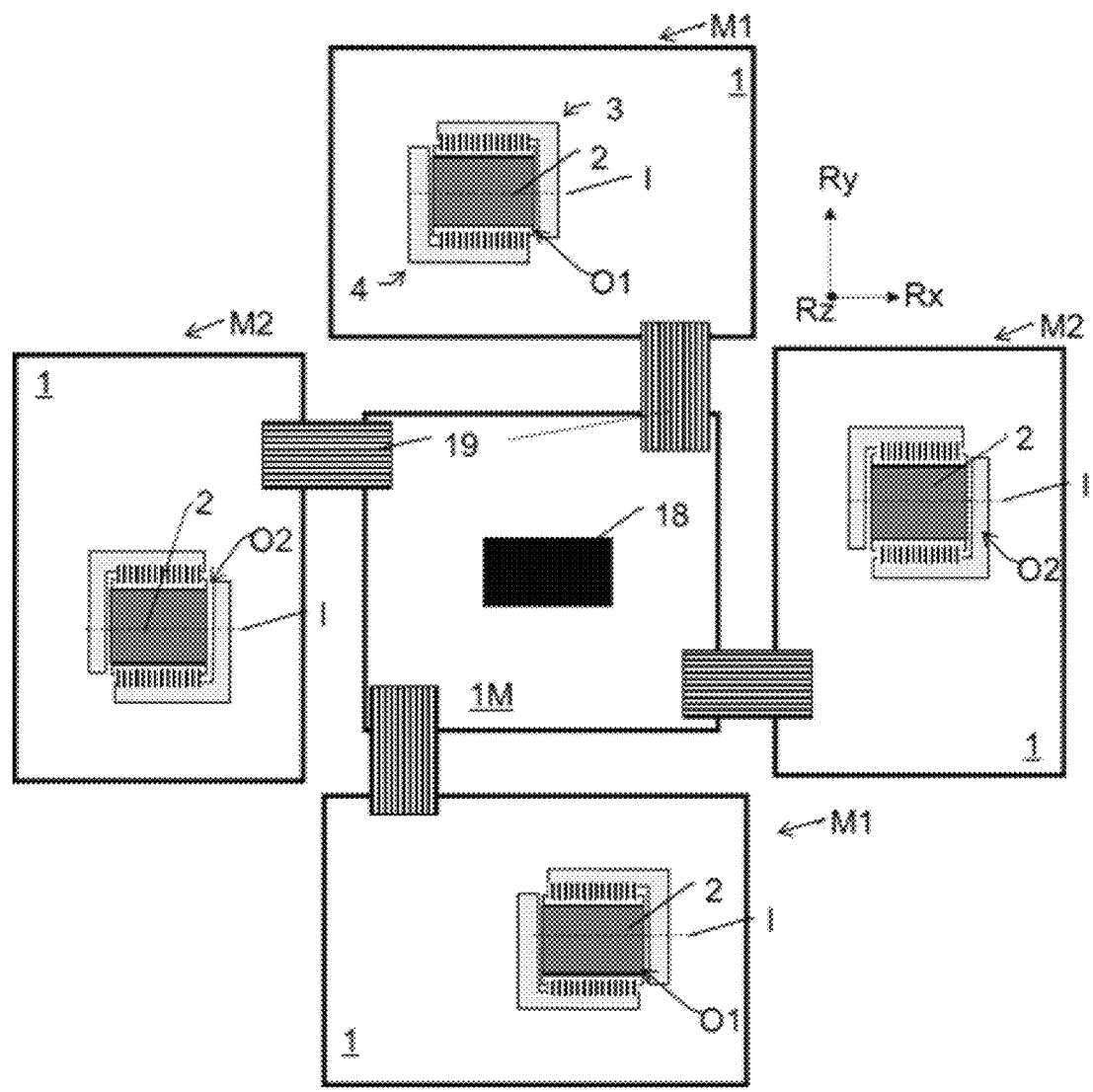
FIG. 6 shows in a schematic way an assembly of multiple optoelectronic modules of a ToF-camera with different orientations.

FIG. 6 shows in a schematic way an assembly of multiple, in the example four optoelectronic modules M1, M2 as described above, the modules having structurally identical printed circuit boards and are part of a ToF-camera and arranged around a central module 1M having an image sensor 18 for receiving light of the VCSELs 2 reflected back by an object. In the example, the four modules M1, M2 are electrically connected by wire bridges 19 to the central module 1M. They are situated around the central module 1M in 90°-distances. Thereby, all modules M1, M2 are facing in the same direction and differ in orientation only by their 90°-shift with respect to the adjacent modules M1, M2. The arrangement is so to say rotational symmetric.

The modules of type M1 differ in the example to the ones of type M2 only by the orientation of the (non-quadratic, rectangular) VCSEL 2. The first modules M1 have the optoelectronic chips 2 mounted in the first orientation O1, the second module M2 in the second orientation O2, differing by 90° to the first orientation O2.

Due to the different chip orientations O1, O2 relative to the PCB 1 or within the module intern reference frame, the chips 2 are all orientated relative to the central module 1M in the same way in that their long side, indicated in the figure by the line 1 is going in the same direction. In other words, though first modules M1 are rotated by 90° in the "global" or camera's frame of reference (indicated by Rx,Ry,Rz) to the second modules M2, this difference in orientation is compensated by the 90° rotation of the chips 2 on the second modules M2 compared to the first modules M1 which is enabled by the multiple-orientation mounting option of the provided PCBs 1. The chips 2, 18 can also be mounted all rotated by 45° compared to the depicted orientation to fill the FoV of the chip 18 with the VCSEL emitters 2.

A skilled person is aware of the fact that details, which are here shown and explained with respect to different embodiments, can also be combined in other permutations if not indicated otherwise.

The invention claimed is:

1. A printed circuit board having a lateral extent and comprising a side landing pad for direct bonding of an optoelectronic chip, wherein the side landing pad comprises a number N>1 of landing areas being differently oriented with regard to the lateral, thus enabling a bonding of the chip in N different lateral orientations relative to the printed circuit board, whereby the electrical connection lengths of the landing areas are equal, wherein the landing areas are connected to each other and have one common electric connection.

2. The printed circuit board according to claim 1, wherein the length of a continuation of the electric path including a respective bonding contact point is orientation-independent for every single bonding contact point.

3. The printed circuit board according to claim 1, wherein the side landing pad comprises N=2 landing areas arranged rectangular to each other.

4. The printed circuit board according to claim 1, comprising a central bottom landing pad.

5. An optoelectronic module comprising a printed circuit board according to claim 1 and a chip bonded to the printed circuit board by way of the printed circuit board's landing pad.

6. The optoelectronic module according to claim 5, wherein the chip is a light emitting chip.

7. The optoelectronic module according to claim 5, wherein the chip is embodied as a vertical cavity surface emitting laser (VCSEL).

8. The optoelectronic module according to claim 5, wherein the chip has a mounting surface of rectangular shape with different length and width and the length of each landing area is aligned to the length of the chip.

9. A time of flight camera having an image sensor, wherein the camera comprises at least a first and a second optoelectronic module according to claim 5, whereby
the modules are mounted concordantly facing in the same direction with different lateral orientation relative to the image sensor,
the first module has a first light emitting chip bonded in the first lateral orientation and
the second module has a second light emitting chip bonded in the second lateral orientation,
such that the different lateral orientations of the first and second chip relative to the printed circuit board compensates the different lateral orientation of the modules relative to the image sensor.

10. The time of flight camera according to claim 9, wherein the camera comprises two first modules and two second modules, arranged alternately and mounted circumferentially around the image sensor in 90°-steps.

11. A time of flight camera having an image sensor, wherein the camera comprises at least a first and a second optoelectronic module according to claim 5, whereby
the modules are mounted concordantly facing in the same direction with same lateral orientation relative to the image sensor,
the first module has a first light emitting chip bonded in the first lateral orientation and
the second module has a second light emitting chip bonded in the second lateral orientation.

12. A printed circuit board having a lateral extent and comprising a side landing pad for direct bonding of an optoelectronic chip, wherein the side landing pad comprises a number N>1 of landing areas being differently oriented with regard to the lateral, thus enabling a bonding of the chip in N different lateral orientations relative to the printed circuit board, whereby the electrical connection lengths of the landing areas are equal, wherein the landing areas are separated and each landing area is contacted by a separate electric connection.

13. The printed circuit board according to claim 12, wherein each landing area is electrically connected at its lateral center.

14. The printed circuit board according to claim 12, wherein the landing areas are electrically connected to a common point by separate feed lines whereby the lengths of all feed lines are equal.

15. The printed circuit board according to claim 12, wherein the side landing pad encompasses the chip landing area semi-circumferentially.

16. The printed circuit board according to claim 12, wherein the side landing pad encompasses the chip landing area semi-circumferentially or wherein the side landing pad comprises N=2 landing areas arranged rectangular to each other.

17. The printed circuit board according to claim 12, wherein the length of a continuation of the electric path including a respective bonding contact point is orientation-independent for every single bonding contact point.

18. An optoelectronic module comprising a printed circuit board according to claim 12 and a chip bonded to the printed circuit board by way of the printed circuit board's landing pad.

19. The optoelectronic module according to claim 18 wherein the chip is a light emitting chip such as a vertical cavity surface emitting laser (VCSEL).

20. A time of flight camera having an image sensor, wherein the camera comprises at least a first and a second optoelectronic module according to claim 19, whereby
the modules are mounted concordantly facing in the same direction with different lateral orientation relative to the image sensor,
the first module has a first light emitting chip bonded in the first lateral orientation and
the second module has a second light emitting chip bonded in the second lateral orientation,
such that the different lateral orientations of the first and second chip relative to the printed circuit board compensates the different lateral orientation of the modules relative to the image sensor.

21. A time of flight camera having an image sensor, wherein the camera comprises at least a first and a second optoelectronic module according to claim 18, whereby
the modules are mounted concordantly facing in the same direction with same lateral orientation relative to the image sensor,
the first module has a first light emitting chip bonded in the first lateral orientation and
the second module has a second light emitting chip bonded in the second lateral orientation.

* * * * *